United States Patent [19]

Hong

[11] Patent Number: 5,522,700

[45] Date of Patent: Jun. 4, 1996

[54] FAN DEVICE FOR INTEGRATED CIRCUIT

[76] Inventor: Chen Fu-in Hong, No. 3, Lane 45, Yi-Yung Road, Kaohsiung, Taiwan

[21] Appl. No.: 399,041

[22] Filed: Mar. 6, 1995

[51] Int. Cl.[6] .................................................. F04D 29/58
[52] U.S. Cl. ........................ 415/177; 165/80.3; 165/122; 361/697
[58] Field of Search ........................... 415/177, 178, 415/214.1, 211.1; 165/80.3, 122, 125, 126, 185; 257/722; 361/695, 696, 697

[56] References Cited

U.S. PATENT DOCUMENTS

| | | | |
|---|---|---|---|
| 5,287,249 | 2/1994 | Chen | 165/80.3 |
| 5,288,203 | 2/1994 | Thomas . | |
| 5,299,632 | 4/1994 | Lee . | |
| 5,309,983 | 5/1994 | Bailey . | |
| 5,335,722 | 8/1994 | Wu | 165/122 |
| 5,368,094 | 11/1994 | Hung | 361/695 |
| 5,409,352 | 4/1995 | Lin | 415/177 |
| 5,421,402 | 6/1995 | Lin | 361/697 |

*Primary Examiner*—Edward K. Look
*Assistant Examiner*—James A. Larson
*Attorney, Agent, or Firm*—Bacon & Thomas

[57] ABSTRACT

A fan device for dissipating heat from an electronic component includes a base having a number of upward extending fins. The fins on the side portions are higher than the middle fins. A board is secured above the shorter fins and engaged between the higher fins, and includes a number of orifices for air circulation purposes. The board includes a support engaged in an opening and coupled to the board for securing a fan. Alternatively, the board may be engaged on top of the higher fins, or, the fins may have identical height and include a depression formed in the middle portion for engagement with the fan.

7 Claims, 9 Drawing Sheets

FAN DEVICE FOR INTEGRATED CIRCUIT

BACKGROUND OF THE INVENTION

1. Field of the Invention

The present invention relates to a fan, and more particularly to a fan device for dissipating heat of integrated circuits.

2. Description of the Prior Art

Typical electrical components, particularly semiconductors, may generate significant heat internally during operation which must be dissipated to avoid damage to the components. To avoid the above-mentioned problem, various kinds of devices have been developed to dissipate the heat. One type of the heat dissipating devices comprise aluminum fins secured to the electrical components for heat transfer purposes. However, the heat transferred to the aluminum fins should also be drawn out in order to dissipate the heat.

U.S. Pat. No. 5,299,632 to Lee, issued on Apr. 5, 1994, entitled "FIN DEVICE FOR INTEGRATED CIRCUIT"; and U.S. Pat. No. 5,309,983 to Bailey, issued on May 10, 1994, entitled "LOW PROFILE INTEGRATED HEAT SINK AND FAN ASSEMBLY" each discloses a heat dissipating device comprising a motorized fan assembly for heat dissipating purposes. However, the motorized fan assemblies occupy a large volume and may not be used for portable computers.

U.S. Pat. No. 5,288,203 to Thomas, issued on Feb. 22, 1994, entitled "LOW PROFILE FAN BODY WITH HEAT TRANSFER CHARACTERISTICS" discloses a fan engaged in a fan frame member for reducing the volume of the fan. However, the fan may not be easily engaged within the fan frame member for reducing the volume of the fan. However, the fan may not be easily engaged within the fan frame members. In addition, the fan base member which is engaged with the heat generating electronic components includes a flat heat transfer surface which may not effectively transfer heat from the electronic components such that the heat dissipating effect thereof is not good enough.

The present invention has arisen to mitigate and/or obviate the aforedescribed disadvantages of the conventional fan devices for integrated circuits.

SUMMARY OF THE INVENTION

The primary objective of the present invention is to provide a fan device for an integrated circuit which occupies a smaller volume that is excellent for use in a portable computer.

The other objective of the present invention is to provide a fan device for an integrated circuit which includes a number of fins for heat transferring purposes and which may effectively dissipate the heat transferred to the fins.

In accordance with one aspect of the invention, there is provided a fan device for dissipating heat from an electronic component, the fan device comprising a base including two side portions having a plurality of first fins extending upward therefrom and including a middle portion having a plurality of second fins extending upward therefrom, the first fins being higher than the second fins, a board member engaged above the second fins and between the first fins, the board member including a plurality of orifices formed therein for air circulation purposes and including an opening formed therein, a support element engaged in the opening and coupled to the board member, means for securing the board member to the second fins, and a fan secured to the support element and located above the second fins for air circulating purposes.

The board member further includes at least two downward extensions, the extensions each including a hook means so as to further secure the board member.

In accordance with another aspect of the invention, there is provided a fan device for dissipating heat from an electronic component. The fan device comprises a board member engaged on top of the higher fins.

In accordance with a further aspect of this invention, there is provided a fan device for dissipating heat from an electronic component. The fan device comprises a base including a number of fins extending upward therefrom and including a depression formed therein. A board member is engaged on top of the fins, and a fan is secured to the board member and engaged in the depression for air circulation purposes.

Further objectives and advantages of the present invention will become apparent from a careful reading of a detailed description provided hereinbelow, with appropriate reference to accompanying drawings.

DETAILED DESCRIPTION OF THE PREFERRED EMBODIMENT

Figure 1:
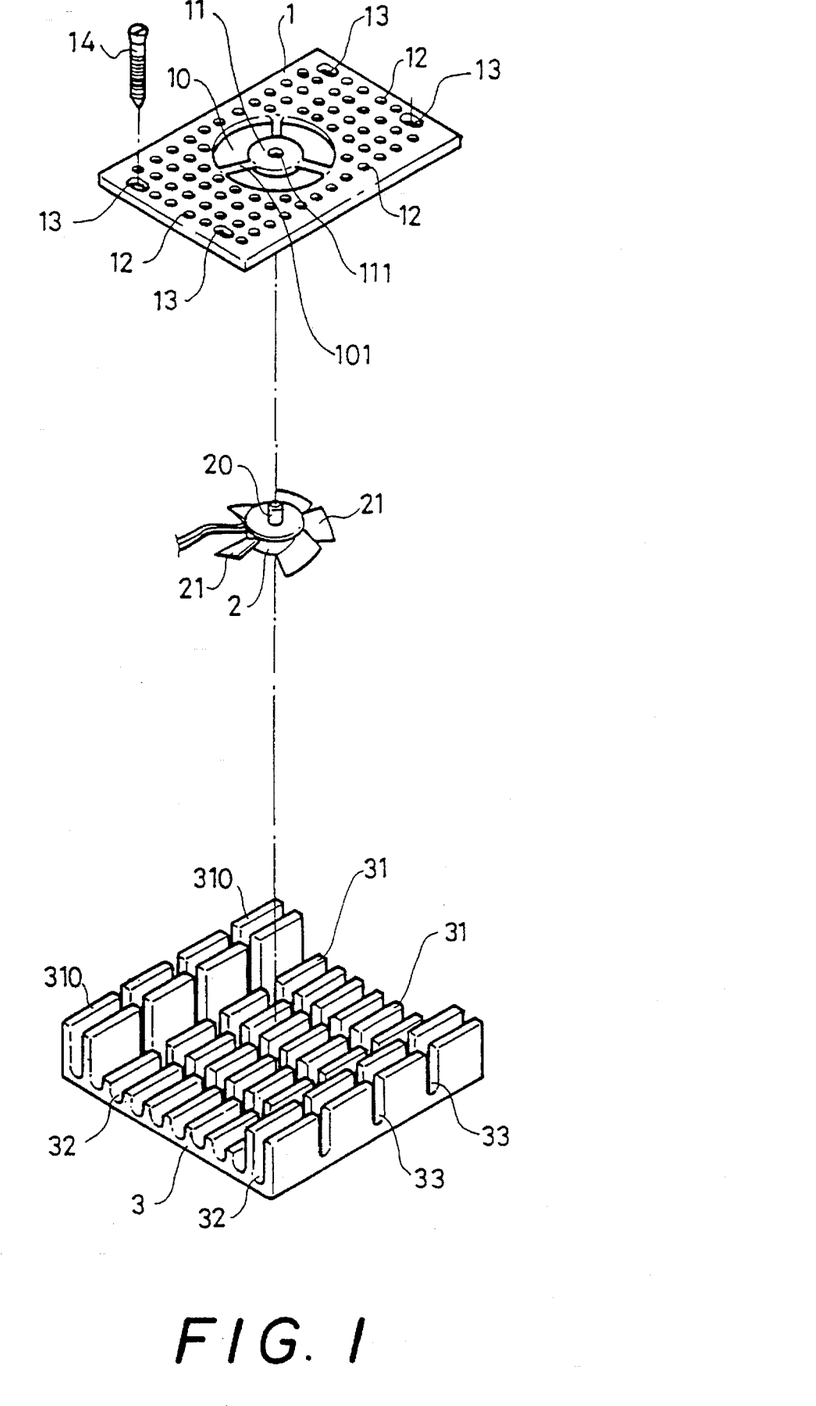
FIG. 1 is an exploded view of a fan device in accordance with the present invention.
Figure 2:
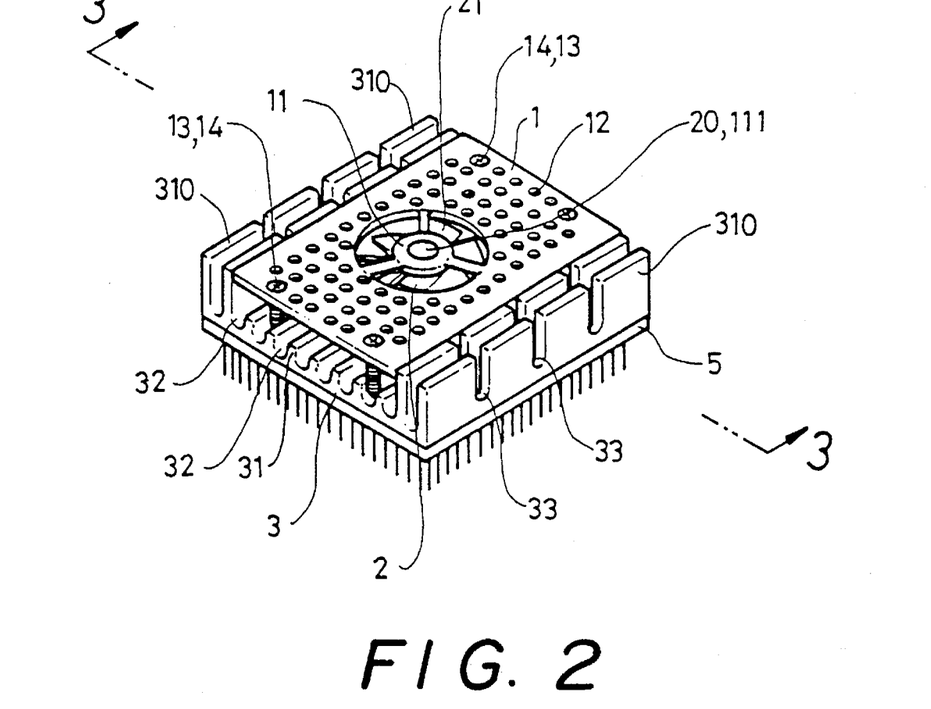
FIG. 2 is a perspective view of the fan device.
Figure 3:
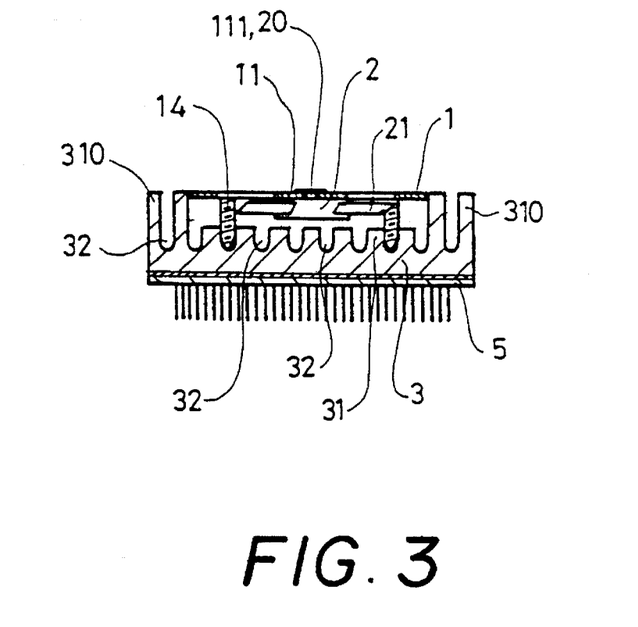
FIG. 3 is a cross sectional view taken along lines 3—3 of FIG. 2.

Referring to the drawings, and initially to FIGS. 1 to 3, a fan device in accordance with the present invention comprises a board member 1 including a number of orifices 12 formed therein for air circulation purposes and including four holes 13 for engaging with screws 14. The board member 1 further includes an opening 10 formed therein and having a support element 11 arranged therein. The support element 11 is coupled to the board member 1 by a number of ribs 101 and includes a bore 111 formed therein. A fan 2 includes a spindle 20 rotatably engaged in the bore 111 of the support element and includes a number of blades 21 for agitating and for circulating air.

A base 3 is preferably made of material having excellent heat transfer characteristics, such as aluminum, and includes a number of fins 31, 310 extending upward therefrom. The fins 31, 310 include a number of rows which are spaced from each other by spaces 32, and each of the rows includes a number of fins which are spaced from each other by gaps 33. The fins 310 are arranged on the two side portions of the base 3 and the other fins 31 are arranged between the fins 310. The base 3 is secured on top of the electronic component 5 for transferring the heat from the electronic component 5. The fins 31, 310 optimize the heat transferring surfaces. The board member 1 is arranged above the lower fins 31, between the higher fins 310 and includes an upper surface flush with the upper surfaces of the higher fins 310, best shown in FIG. 3. The screws 14 are engaged within the spaces 32 for securing the board member 1 to the base 3.

Accordingly, the heat of the electronic components 5 is transferred to the fins 31, 310 and is effectively dissipated by the fan 2. In addition, the fan device occupies a relatively small volume that is excellent for use in portable computers and that is excellent for dissipating heat from an electronic component.

Figure 4:
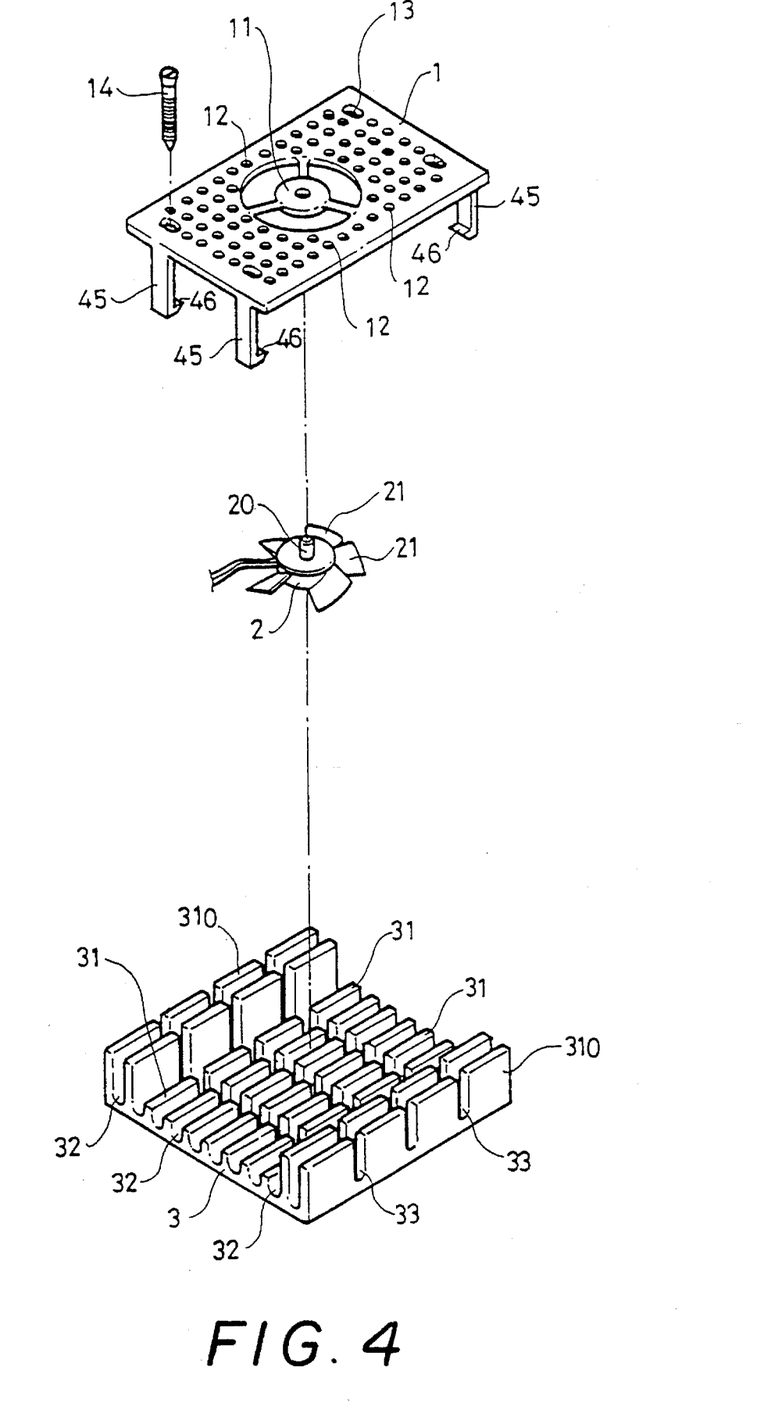
FIG. 4 is an exploded view illustrating another application for securing the board member to the base of the fan device.
Figure 5:
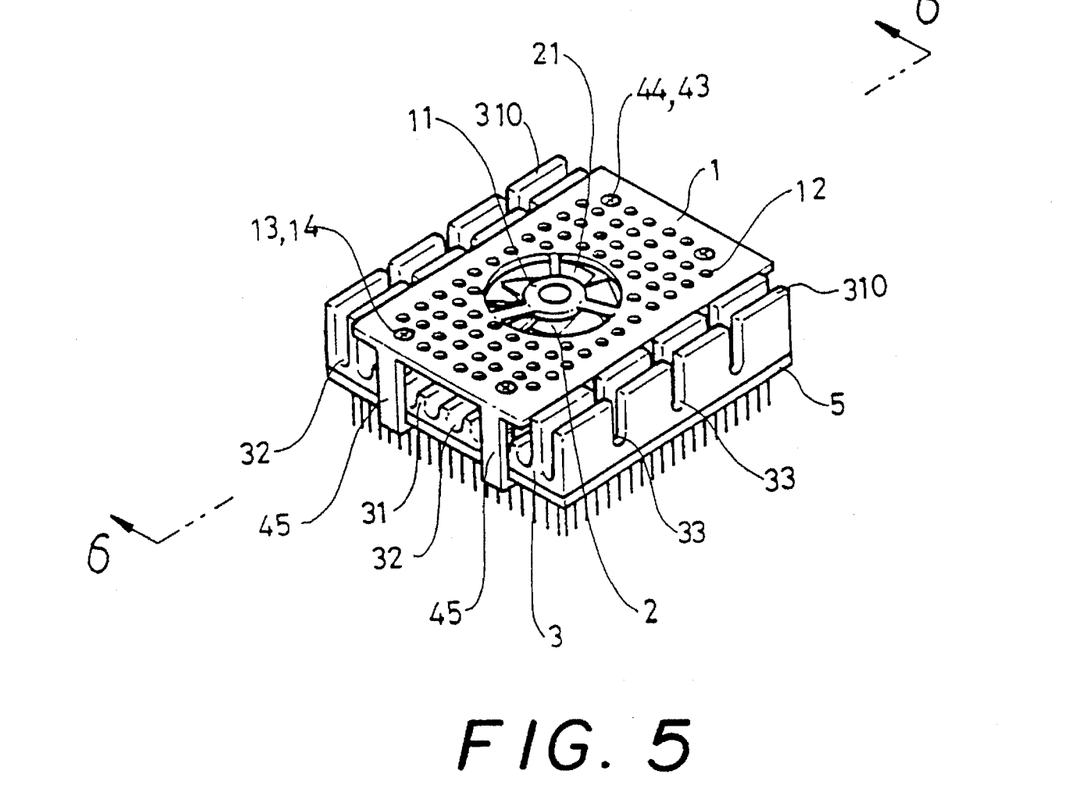
FIG. 5 is a perspective view showing the fan device as shown in FIG. 4.
Figure 6:
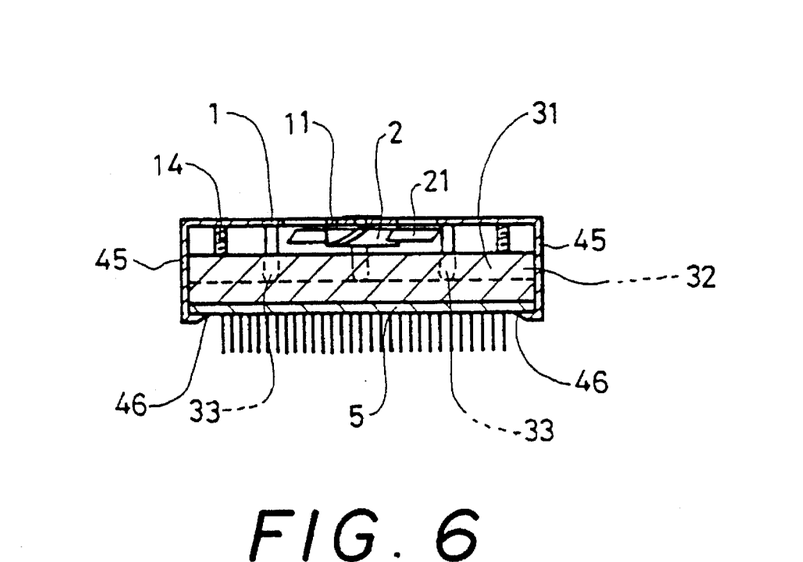
FIG. 6 is a cross sectional view taken along lines 6—6 of FIG. 5.

Referring next to FIGS. 4 to 6, the board member 1 may further include four extensions 45 extending downward therefrom, the extensions 45 each including a hook element 46 to further solidly secure the board member 1.

Figures 7, 8:
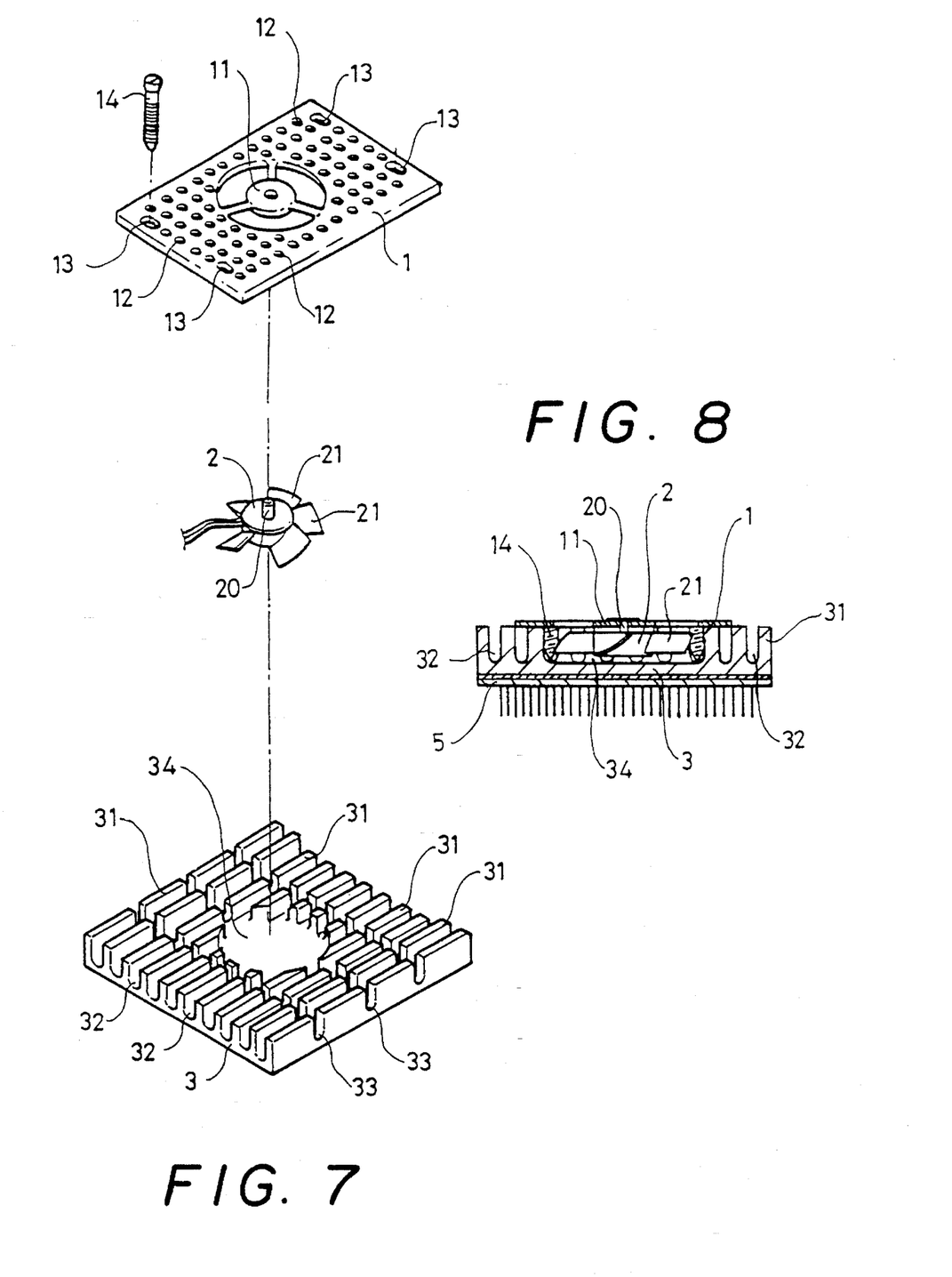
FIG. 7 is an exploded view illustrating a further application for securing the board member to the base of the fan device.
FIG. 8 is a cross sectional view of the fan device as shown in FIG. 7.

Referring next to FIGS. 7 and 8, the fins 31 of the base 3 include identical height and include a depression 34 formed in the center portion for receiving the fan 2, such that the fan device has a further reduced thickness.

Figures 9, 10:
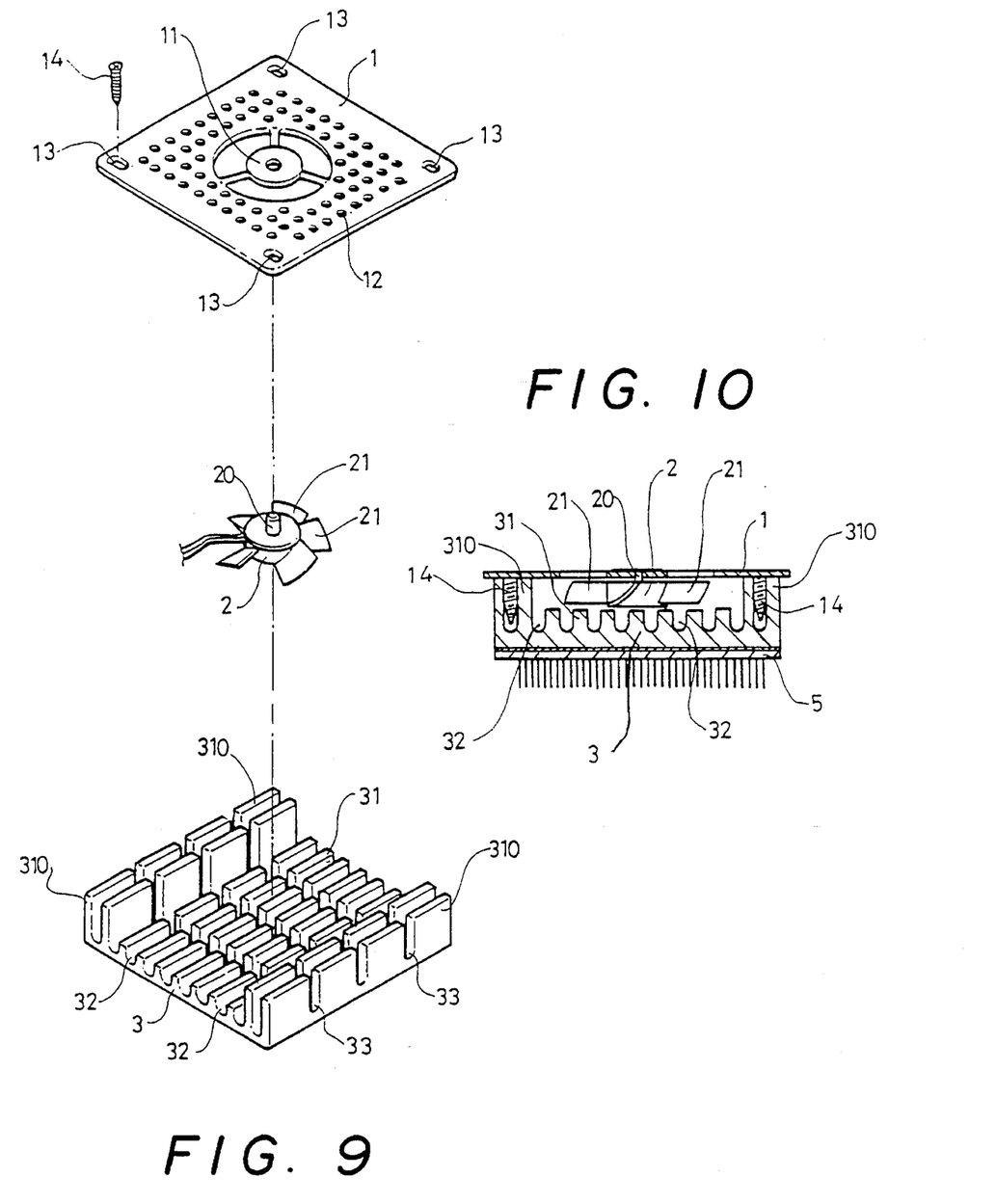
FIG. 9 is an exploded view illustrating a still further application for securing the board member to the base of the fan device.
FIG. 10 is a cross sectional view of the fan device as shown in FIG. 9.

Referring next to FIGS. 9 and 10, the board member 1 may have a larger size for engaging the top of the higher fins 310, and the screws 14 are engaged between the higher fins 310 for securing the board member 1 to the base 3.

Figure 11:
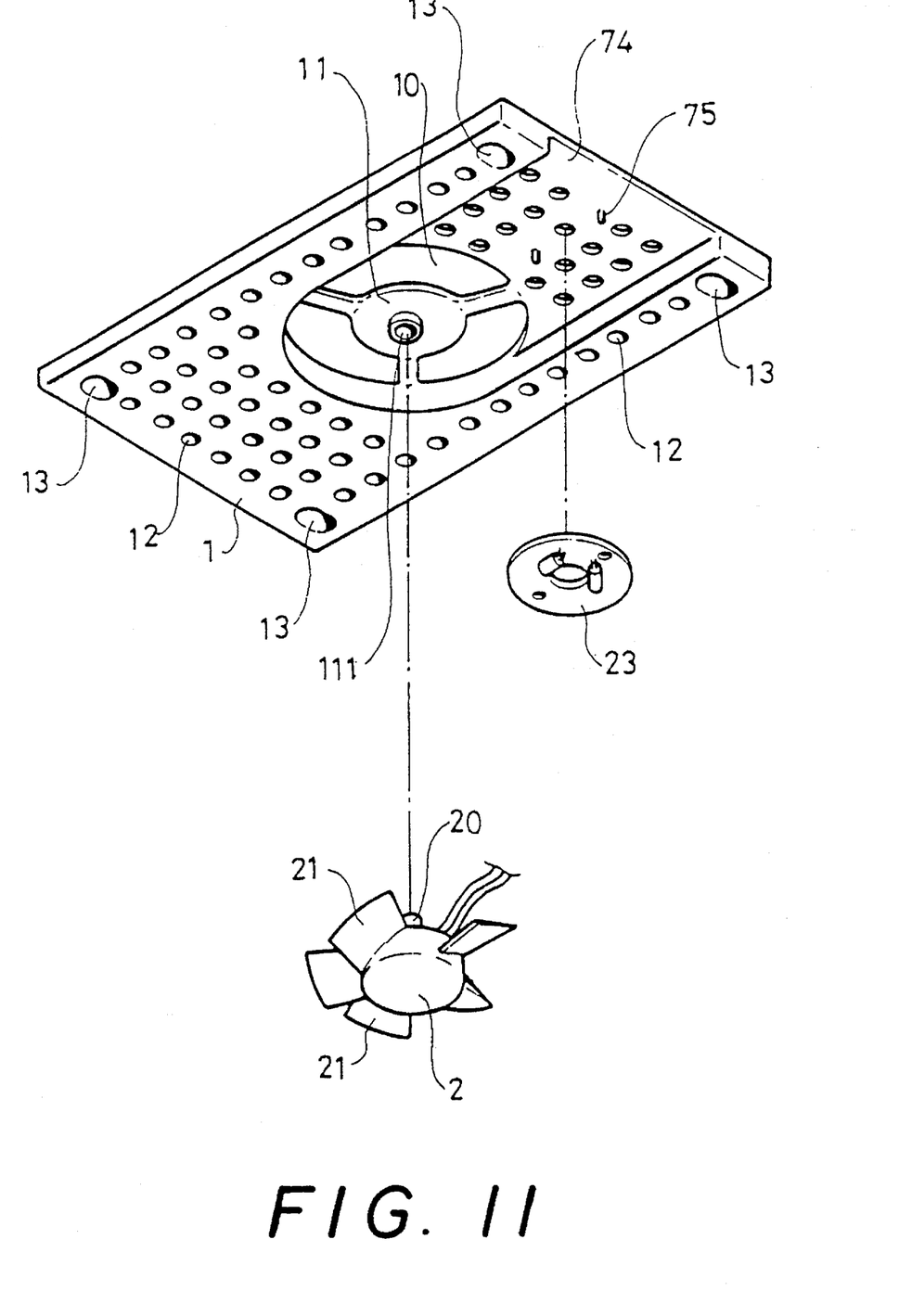
FIGS. 11, 12, 13 are exploded views illustrating three embodiments of the board member.
Figure 12:
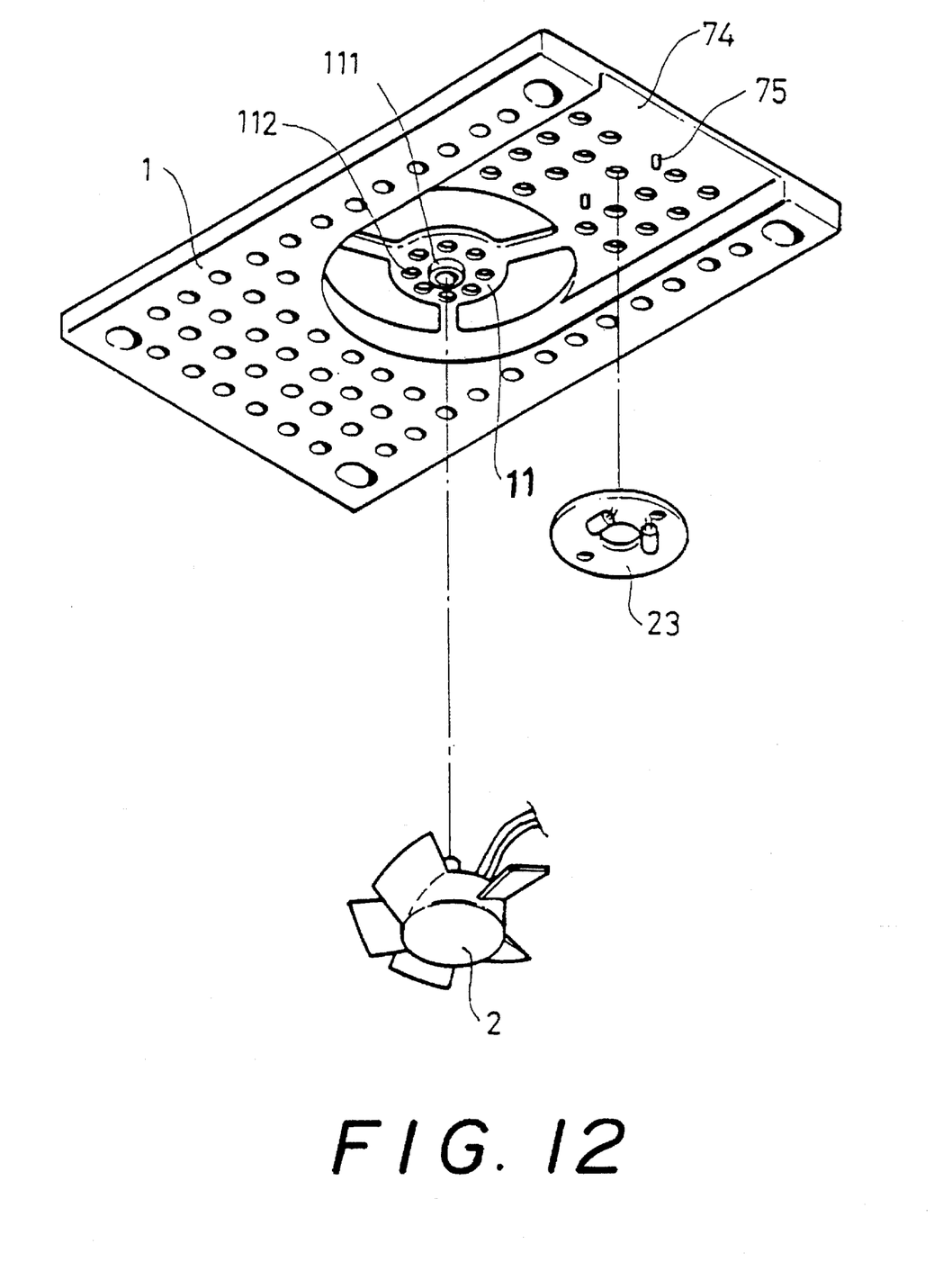
Figure 13:
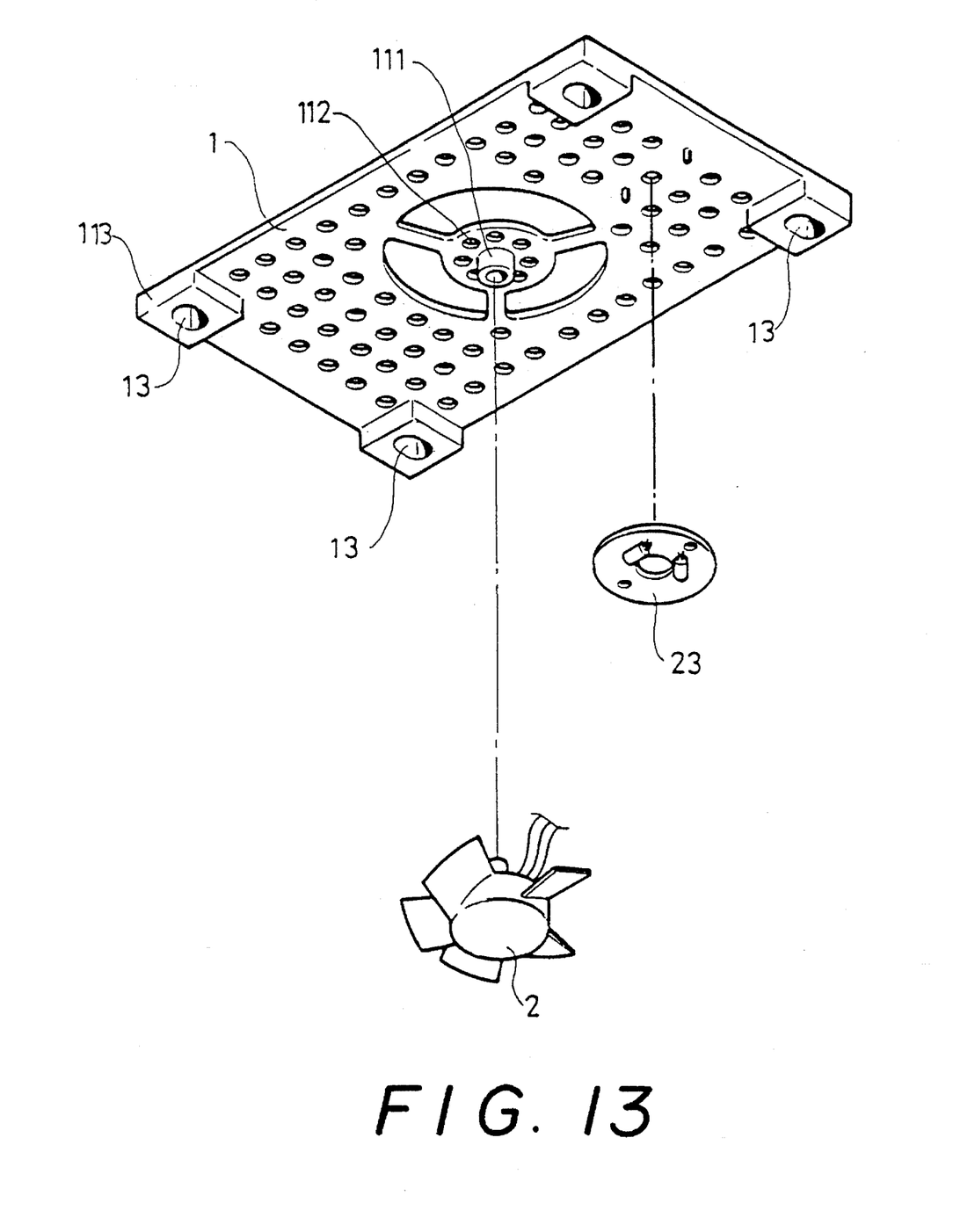

Referring next to FIG. 11, the board member 1 may include a recess 74 formed therein and include two studs 75 for securing a circuit board 23. The circuit board 23 is received in the recess 74 and will not increase the thickness of the board member 1. The opening 10 of the board member 1 is communicated with the recess 74. As shown in FIG. 12, the support element 11 may also include orifices 112 formed therein for air circulation purposes and for mounting other objects. As shown in FIG. 13, the corner areas 113 of the board member 1 may include a larger thickness so as to increase the strength of the engaging holes 13. The board members 1 as shown in FIGS. 11 to 13 may be used for engaging with any of the bases 3 shown in FIGS. 1 to 10.

Accordingly, the fan device in accordance with the present invention having a relatively small volume that is excellent for use in a portable computer and that is excellent for dissipating heat from an electronic component.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:

1. A fan device for dissipating heat from an electronic component, said fan device comprising:

a base including two side portions having a plurality of first fins extending upward therefrom and including a middle portion having a plurality of second fins extending upward therefrom, said first fins being higher than said second fins;

a board member engaged above said second fins and between said first fins, said board member including a plurality of orifices formed therein for air circulation therethrough and including an opening formed therein, a support element engaged in said opening and coupled to said board member;

means for securing said board member to said second fins; and, a fan secured to said support element and located above said second fins for circulating air.

2. A fan device according to claim 1, wherein said board member further comprises at least two extensions extending downward therefrom, said extensions each including a hook means.

3. A fan device according to claim 1, wherein said board member further comprises a recess formed therein, wherein said opening communicates with said recess, said board member further comprising stud means extending inward of said recess for securing objects.

4. A fan device according to claim 1, wherein said support element includes a plurality of orifices formed therein for air circulation therethrough.

5. A fan device according to claim 1, wherein said board member further comprises four corner areas each having a hole formed therein for engagement with said securing means, said corner areas each having a thickness larger than that of the rest of said board member.

6. A fan device for dissipating heat from an electronic component, said fan device comprising:

a base including two side portions having a plurality of first fins extending upward therefrom and including a middle portion having a plurality of second fins extending upward therefrom, said first fins being higher than said second fins;

a board member engaged on top of said first fins and including a plurality of orifices formed therein for air circulation therethrough and including an opening formed therein, a support element engaged in said opening and coupled to said board member;

means for securing said board member to said first fins; and, a fan secured to said support element and located above said second fins for circulating air.

7. A fan device for dissipating heat from an electronic component, said fan device comprising:

a base including a plurality of fins extending upward therefrom and including a middle portion having a depression formed therein;

a board member engaged on top of said fins and including a plurality of orifices formed therein for air circulation therethrough and including an opening formed therein, a support element engaged in said opening and coupled to said board member;

means for securing said board member to said fins; and, a fan secured to said support element and located within said depression for circulating air.

* * * * *